(12) United States Patent
Morris et al.

(10) Patent No.: US 10,734,378 B2
(45) Date of Patent: Aug. 4, 2020

(54) TRANSISTOR THRESHOLD VOLTAGE VARIATION OPTIMIZATION

(71) Applicant: INTEL CORPORATION, Santa Clara, CA (US)

(72) Inventors: Daniel H. Morris, Hillsboro, OR (US); Uygar E. Avci, Portland, OR (US); Ian A. Young, Portland, OR (US)

(73) Assignee: Intel Corporation, Santa Clara, CA (US)

(*) Notice: Subject to any disclaimer, the term of this patent is extended or adjusted under 35 U.S.C. 154(b) by 0 days.

(21) Appl. No.: 16/080,914

(22) PCT Filed: Apr. 1, 2016

(86) PCT No.: PCT/US2016/025663
§ 371 (c)(1),
(2) Date: Aug. 29, 2018

(87) PCT Pub. No.: WO2017/171860
PCT Pub. Date: Oct. 5, 2017

(65) Prior Publication Data
US 2019/0019793 A1    Jan. 17, 2019

(51) Int. Cl.
| | | |
|---|---|---|
| H01L 27/088 | (2006.01) | |
| H01L 29/78 | (2006.01) | |
| H01L 29/51 | (2006.01) | |
| H01L 21/8234 | (2006.01) | |
| H01L 29/423 | (2006.01) | |
| H01L 29/49 | (2006.01) | |

(52) U.S. Cl.
CPC .... *H01L 27/088* (2013.01); *H01L 21/823437* (2013.01); *H01L 29/517* (2013.01); *H01L 29/78* (2013.01); *H01L 29/42372* (2013.01); *H01L 29/4966* (2013.01)

(58) Field of Classification Search
None
See application file for complete search history.

(56) References Cited

U.S. PATENT DOCUMENTS

| | | |
|---|---|---|
| 2007/0034966 A1 | 2/2007 | Kim |
| 2010/0038725 A1 | 2/2010 | Chudzik et al. |
| 2010/0327373 A1 | 12/2010 | Carter et al. |

(Continued)

OTHER PUBLICATIONS

Dadgour, H. "Statistical Modeling of Metal-Gate Work Function Variability in Emerging Device Technologies and Implications for Circuit Design" 2008 IEEE/ACM International Conference on Computer-Aided Design Nov. 18, 2008 pp. 1-8) (Year: 2008).*

(Continued)

*Primary Examiner* — Grant S Withers
(74) *Attorney, Agent, or Firm* — Grossman, Tucker, Perreault & Pfleger, PLLC

(57) ABSTRACT

One embodiment provides an apparatus. The apparatus includes a first transistor and a second transistor. The first transistor includes a first drain, a first source coupled to the first drain by a first channel, and a first gate stack comprising a plurality of layers. The second transistor includes a second drain, a second source coupled to the second drain by a second channel, and a second gate stack comprising a plurality of layers. Each gate stack includes a work function material layer to optimize a threshold voltage variation between the transistors.

19 Claims, 1 Drawing Sheet

(56) References Cited

U.S. PATENT DOCUMENTS

| | | |
|---|---|---|
| 2012/0306026 A1 | 6/2012 | Guo |
| 2013/0240996 A1 | 9/2013 | Yin |
| 2015/0255607 A1* | 9/2015 | Lim .................... H01L 29/7848 |
| | | 257/192 |
| 2017/0250279 A1* | 8/2017 | Wei ..................... H01L 29/7848 |

OTHER PUBLICATIONS

Alshareef, H. N. "Metal gate work function engineering using AlNx interfacial layers" Appl. Phys. Lett. 88, Mar. 16, 2006 pp. 112114-1 through 112114-3) (Year: 2006).*
International Search Report received in PCT Application No. PCT/US2016/025663, dated Apr. 1, 2016, 9 pages.
International Preliminary Report on Patentability received in PCT Application No. PCT/US2016/025663, dated Oct. 2, 2018.

* cited by examiner

TRANSISTOR THRESHOLD VOLTAGE VARIATION OPTIMIZATION

FIELD

The present disclosure relates to transistor threshold voltage variation, in particular to, transistor threshold voltage variation optimization.

BACKGROUND

Integrated circuits may include several transistors configured to perform a variety of functions. Subsets of the transistors may be grouped into a plurality of "flavors" according to one or more transistor operating characteristics. For example, transistor operating characteristics may include operating voltage, leakage current, drive current, threshold voltage, etc. The specific flavors of transistors may depend on material selection, fabrication process and/or one or more process parameters. The operating characteristics may be prioritized. For example, minimizing leakage current may be a relatively high priority in order to meet power consumption constraints.

BRIEF DESCRIPTION OF DRAWINGS

Features and advantages of the claimed subject matter will be apparent from the following detailed description of embodiments consistent therewith, which description should be considered with reference to the accompanying drawings, wherein:

Figure 1:
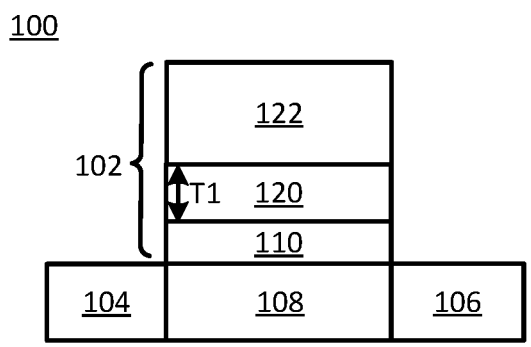
FIG. 1 illustrates one example transistor structure configured to optimize transistor threshold voltage variation consistent with an embodiment of the present disclosure.

Although the following Detailed Description will proceed with reference being made to illustrative embodiments, many alternatives, modifications, and variations thereof will be apparent to those skilled in the art.

DETAILED DESCRIPTION

In some applications, threshold voltage variation may affect operation of a device. For example, variation between the respective threshold voltages of two transistors configured as a differential pair may constrain (i.e., limit) a minimum voltage difference that the differential pair may detect. Transistors arranged as a differential pair may be utilized in, for example, differential amplifiers, sense amplifiers, comparators, etc. An amount of threshold voltage variation may be related to a physical size of the transistors. For example, size reduction associated with scaling may increase threshold voltage variation between two transistors. The threshold voltage variation may be random and/or may be due to process variations.

Threshold voltage values for a plurality of transistors may have a distribution across the plurality of transistors. Threshold voltage variation may correspond to a standard deviation, $\sigma_{VT}$, of the distribution of threshold voltages. The standard deviation, $\sigma_{VT}$, is inversely proportional to the square root of a product of a transistor channel width and a transistor channel length, i.e., $\sigma_{VT}=A_{VT}/\sqrt{WL}$, where W and L are transistor channel width and channel length, respectively. For threshold voltage values with units of millivolts (mV) and transistor channel dimension (i.e., channel length and channel width with units of micrometers (μm), $\sigma_{VT}$ has units of mV and $A_{VT}$ has units of mV-μm. $A_{VT}$ is a constant of proportionality and may be understood as an empirical figure of merit related to a process technology. Process technology is related to a minimum feature size and/or spacing (i.e., pitch) between adjacent elements. For example, process technology may include, but is not limited to, 22 nanometers (nm), 14 nm, 10 nm and/or smaller or larger process technologies. Channel length and/or channel width may vary, by design, within a process technology. Process technology (i.e., minimum feature size and/or spacing) may generally decrease with each subsequent generation, e.g., 22 nm to 14 nm. While $A_{VT}$ may improve (i.e., decrease) with each technology generation, the transistor channel dimensions, W and L, may also decrease as technology advances. The standard deviation, $\sigma_{VT}$, may thus increase as process technology decreases for a same configuration, e.g., a same gate stack structure, same materials and similar process.

In some situations, e.g., analog circuitry, the leakage current of the transistors included in the differential pair may not contribute substantially to the power consumption and/or standby power of the associated device. For example, the transistors may be included in a circuit that is always powered so that leakage current in a standby mode is relatively unimportant. In another example, the transistors may be included in a circuit that is relatively high power so that a contribution of the leakage current associated with the transistors may be relatively small. In another example, the transistors may be included in a circuit that may be controllably coupled to or decoupled from a power supply. Thus, leakage power associated with such circuits may not contribute significantly to device standby power consumption.

Thus, a flavor of transistor that is configured to optimize threshold voltage variation may be included in a device and utilized for, for example, differential pairs. Other flavors of transistors configured to minimize leakage current, maximize a threshold voltage, etc., may be included in the device and utilized in circuits whose operation affects power consumption and/or standby power.

Generally, this disclosure relates to transistor threshold voltage variation optimization. A transistor, e.g., a MOSFET (metal oxide semiconductor field effect transistor), may include a gate stack structure configured to reduce and/or minimize a work function variation. Work function is a characteristic of a semiconductor corresponding to an intrinsic potential at the gate (e.g., gate metal) that determines how turned-on the transistor is when gate is biased at 0V. Leakage current (i.e., current through a transistor when the transistor is off) is related to threshold voltage. It may be appreciated that threshold voltage variation is related to variation in work function of materials utilized in the gate stack. In other words, reducing variation in work function of gate stack materials may correspond to reducing threshold voltage variation. Thus, reducing and/or minimizing work function variation between transistors may correspond to reducing and/or minimizing, i.e., optimizing, a threshold voltage variation between transistors. As used herein, an optimized threshold voltage variation corresponds to a constant of proportionality, $A_{VT}$, of less than 1 mV-μm. The constant of proportionality, $A_{VT}$, relates a standard deviation, $\sigma_{VT}$, of a distribution of threshold voltage values, $V_T$, and a transistor channel dimension, as described herein.

For example, $A_{VT}$<1 mV-μm for a 22 nm process technology node and a minimum device size, i.e., minimum channel width and minimum channel length, corresponds to $\sigma_{VT}$ less than 30 mV. In another example, $A_{VT}$<1 mV-μm for a 14 nm process technology node may correspond to $\sigma_{VT}$ less than 30 mV for minimum device size. Continuing with this example, $\sigma_{VT}$ may be 19 mV or 24 mV depending on device type and/or measurement technique. In other words, $\sigma_{VT}$ may be substantially less than 30 mV for a 14 nm process and minimum device size. As used herein, "substantially" is at least 20 percent (%).

A gate stack structure, consistent with the present disclosure, may be configured to reduce and/or minimize work function variation between transistors and to thus, optimize a corresponding threshold voltage variation across a plurality of transistors. In an embodiment, the gate stack structure may contain selected materials (i.e., work function materials) configured to minimize variation in the work function. In another embodiment, the work function materials may be configured to include selected metal crystal structures or amorphous structures. Crystal structures may be single crystal or polycrystalline. In another embodiment, the work function materials may include metal crystal structures with a selected polycrystalline size. In another embodiment, a film thickness associated with the work function materials may be selected to reduce and/or minimize work function variation. In another embodiment, the gate stack may be heterogeneous, i.e., may include a plurality of work function materials, metal structures, polycrystalline sizes and/or layers of work function materials. In another embodiment, the gate stack may include a plurality of the foregoing embodiments.

Thus, an apparatus, integrated circuit, device and/or system may contain a plurality of transistors of a plurality of transistor flavors. Some of the transistors, e.g., transistors utilized in differential pairs, may each contain a gate stack configured to minimize work function variation and thus optimize a threshold voltage variation between the transistors.

FIG. 1 illustrates one example transistor structure 100 configured to optimize transistor threshold voltage variation consistent with an embodiment of the present disclosure. For example, transistor structure 100 may correspond to a MOSFET. For example, transistor structure may 100 may include, but is not limited to, a finFET, a nanowire structure, a gate-all-around structure, a bulk structure and/or an SOI (silicon on insulator) structure. Transistor structure 100 includes a gate stack 102, a source 104, a drain 106 and a channel 108. The gate stack 102 is adjacent the channel 108. The gate stack 102 includes an insulator 110 adjacent the channel 106, a first work function material layer 120 adjacent the insulator 110 and a gate electrode (i.e., gate metal layer) 122 adjacent the first work function material layer 120. Insulator 110 may include an insulator material. Insulator materials may include, but are not limited to, silicon dioxide, silicon oxynitride, HfOx (Hafnium Oxide), ZrOx (Zirconium Oxide), HfZrOx, TiOx (Titanium Oxide) and/or combinations thereof. Gate electrode 122 may include one or more gate materials. Gate materials may include, but are not limited to, TiN (titanium nitride), and/or polysilicon. Gate stack 102 is configured to reduce and/or minimize work function variation and thus optimize threshold voltage variation between a plurality of transistors, each transistor configured according to transistor structure 100.

In an embodiment, the gate stack structure 102 may contain a selected material (i.e., a work function material) configured to minimize the work function variation associated with transistor structure 100. For example, one or more work function materials may be included in first work function material layer 120. A first group of work function materials may include, but are not limited to, silver (Ag), gold (Au), cobalt (Co), molybdenum (Mo), ruthenium (Ru), tin (Sn), aluminum (Al), tungsten (W), platinum (Pt) and/or tantalum (Ta). A second group of work function materials may include two-dimensional materials, i.e., materials that have a crystal structure in two-dimensions only with no electrical connection into the third dimension except Van der walls bonds. Two dimensional materials may include, but are not limited to, graphene, metallic TMDs (transition metal dichalcogenide), NbS2 (niobium sulfur 2), VS2 (vanadium sulfur 2), WTe2 (tungsten tellurium 2) and/or TiSe2 (titanium selenium 2). Thus, the first work function material layer 120 may contain work function materials selected from the first group of work function materials or the second group of work function materials, as described herein.

In another embodiment, the first work function material layer 120 and associated work function materials may be configured to include selected metal crystal or noncrystalline structures. The selected metal structures may be configured to reduce the work function variation of the corresponding work function material. A crystal structure or a noncrystalline structure is a property of a work function material. Solid materials, e.g., work function materials, may have a crystalline, polycrystalline or amorphous structure. Crystalline corresponds to a nearly perfect periodic (i.e., repetitive) crystal structure. Polycrystalline corresponds to a crystal structure with densely packed crystallites (i.e., grains) of a single crystal. Amorphous corresponds to a noncrystalline structure, i.e., without atomic or molecular ordering.

For example, the first work function material layer 120 may contain a work function material with an amorphous structure. In another example, the first work function material layer 120 may contain a work function material with a crystalline crystal structure. In another example, the first work function material layer 120 may contain a work function material with a polycrystalline crystal structure.

A polymorphic work function material may have one or more possible crystal phases, each phase having a specific structure. Crystal phases may include, for example, alpha phase, beta phase, etc. Each crystal phase is related to a respective crystalline or polycrystalline structure. An actual crystal structure and/or crystal phase of a work function material is related to a process, i.e., the process used to fabricate the material layer. In other words, the first work function material layer 120 may be fabricated to have a selected noncrystalline structure, a crystal structure or the crystal structure and an associated crystal phase by selecting a process and/or selecting and/or controlling one or more process parameters. For example, processes that affect noncrystalline (i.e., amorphous) structure, crystal structure and/or crystal phase may include, but are not limited to, vapor deposition (VD), e.g., physical vapor deposition, chemical vapor deposition (CVD), metal-organic CVD and/or phase epitaxy CVD; and/or sputtering. For example, process parameters that affect noncrystalline (i.e., amorphous) structure, crystal structure and/or crystal phase may include, but are not limited to, process temperature during growth of these materials, adding or changing anneal temperatures after the growth, and capping with another material at the end of processing configured to change a final strain in the gate material.

In another embodiment, for first work function material layer 120 and associated work function materials that have a polycrystalline structure, the polycrystalline structure may have a selected associated polycrystalline grain size (i.e., crystallinity). Polycrystalline size (i.e., polycrystalline grain size) is a characteristic of polycrystalline crystal structures. Similar to the crystal structure itself, polycrystalline size is related to a selected process and/or one or more process parameters. For example, polycrystalline grain size may be in the range of 10 Angstroms (A) to 500 A. For example, processes and/or process parameters that affect polycrystalline size may include, but are not limited to, the processes and/or process parameters that affect noncrystalline (i.e., amorphous) structure, crystal structure and/or crystal phase, as described herein.

In another embodiment, a film thickness, T1, of the first work function material layer 120 may be selected to reduce and/or minimize work function variation. For example, film thickness T1 may be in the range of 1 A to 500 A. A sufficient volume of a material may have bulk properties, e.g., electrical characteristics such as work function, independent of thickness. Material properties associated with a lesser volume of the material, e.g., film thicknesses in the foregoing range, may vary with thickness, e.g., film thickness T1. Thus, selecting the film thickness T1 of the first work function material layer 120 may determine the work function (i.e., nominal work function value) associated with the first work function material layer 120. Selecting the film thickness of the first work function material layer 120 may thus determine the corresponding threshold voltage (and threshold voltage value distribution for a plurality of transistors) associated with transistor structure 100.

In another embodiment, the first work function material layer 120 may be heterogeneous, i.e., may include a plurality of work function materials, amorphous structures, crystal structures, crystal phases and/or polycrystalline sizes.

Thus, example transistor structure 100 may be configured to optimize transistor threshold voltage variation between a plurality of transistors. Each transistor of the plurality of transistors may correspond to one selected embodiment of transistor structure 100.

Figure 2:
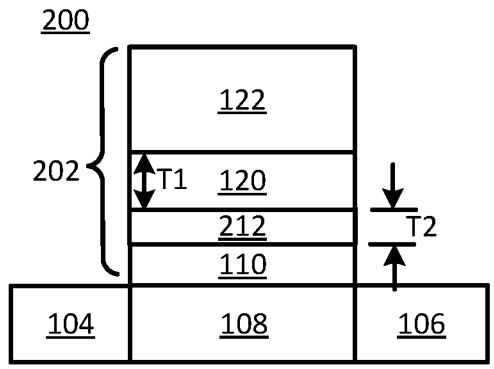
FIG. 2 illustrates another example transistor structure configured to optimize transistor threshold voltage variation consistent with another embodiment of the present disclosure.

FIG. 2 illustrates another example transistor structure 200 configured to optimize transistor threshold voltage variation consistent with another embodiment of the present disclosure. Like reference designators correspond to like elements for FIG. 1 and FIG. 2. Transistor structure 200 includes a gate stack 202 and the source 104, the drain 106 and the channel 108 as described in FIG. 1. The gate stack 202 includes the insulator 110 adjacent the channel 106, the first work function material layer 120 and the gate electrode 122 adjacent the first work function material layer 120. The gate stack 202 further includes a second work function material layer 212 positioned between the insulator 110 and the first work function material layer 120.

The first work function material layer 120 may contain the work function materials as described herein with respect to gate stack 102. The first work function material layer 120 has thickness T1, as described herein. The work function materials contained in first work function material layer 120 may have an amorphous structure, a crystal structure and/or a crystal phase, as described herein with respect to gate stack 102. In an embodiment, the second work function material layer 212 may include a two-dimensional material, e.g., a work function material selected from the second work function material group, as described herein. The second work function material layer 212 may have a thickness T2. For example, the thickness T2 may be in the range of 1 A to 500 A.

Thus, a gate stack, e.g., gate stack 202, configured to optimize an associated transistor threshold voltage variation may include a plurality of work function material layers. In other words, the work function material layers 120, 212 may be heterogeneous.

Figure 3:
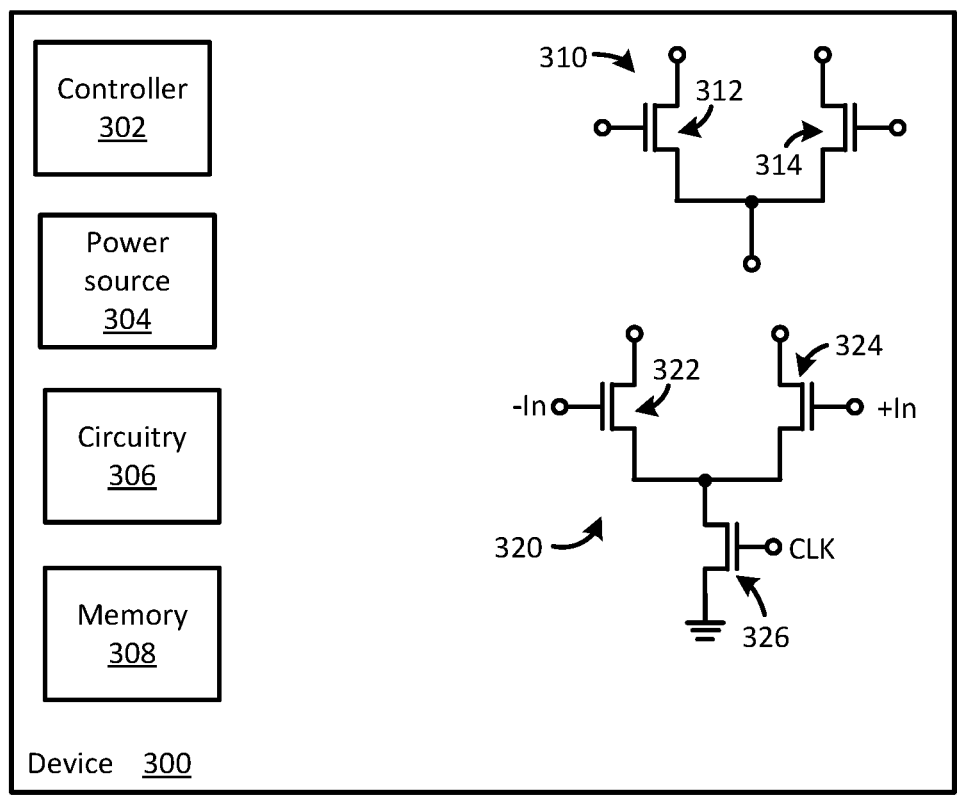
FIG. 3 illustrates a functional block diagram of a device consistent with several embodiments of the present disclosure.

FIG. 3 illustrates a functional block diagram of a device 300 consistent with several embodiments of the present disclosure. Device 300 includes a controller 302, a power source 304, circuitry 306 and memory 308. Device 300 may include a differential pair 310 and/or a sense amplifier 320.

Device 300 may include, but is not limited to, an integrated circuit, a mobile telephone including, but not limited to a smart phone (e.g., iPhone®, Android®-based phone, Blackberry®, Symbian®-based phone, Palm®-based phone, etc.); a wearable device (e.g., wearable computer, "smart" watches, smart glasses, smart clothing, etc.) and/or system; an Internet of Things (IoT) networked device including, but not limited to, a sensor system (e.g., environmental, position, motion, etc.) and/or a sensor network (wired and/or wireless); etc.

Controller 302 is configured to control operation of device 300. Power source 304 is configured to supply power to elements of device 300 including differential pair 310 and/or sense amplifier 320. For example, controller 302 may be configured to controllably couple power source 304 to differential pair 310 and/or sense amplifier 320. Circuitry 306 may include transistors of one or more flavors, e.g., configured to minimize leakage current, minimize threshold voltage and/or maximize drive current, etc. Circuitry 306 may further include one or more of resistors, capacitors, conductive traces, etc. Memory 308 may include any type of memory, as described herein.

Differential pair 310 includes a first transistor 312 and a second transistor 314 configured as a differential pair. The first transistor 312 and the second transistor 314 may each include a respective gate stack configured to optimize a threshold voltage variation between the first transistor 312 and second transistor 314, as described herein. For example, transistors 312 and 314 may correspond to transistor structure 100 of FIG. 1. In other example, transistors 312 and 314 may correspond to transistor structure 200 of FIG. 2. The differential pair 310 may be controllably coupled to power source 304 to receive power. The differential pair 310 may be coupled to controller 302 for reading an output of the differential pair 310. One or more inputs of differential pair 310 may be coupled to circuitry 306.

Sense amplifier 320 includes a first transistor 322, a second transistor 324 and a current source 326. The first transistor 322 and the second transistor 324 are configured as a differential pair. A gate electrode of the first transistor 322 is coupled to a negative input and a gate electrode of the second transistor 324 is coupled to a positive input of a corresponding differential signal. For example, the differential signal may be related to a state of a memory cell included in memory 308. Continuing with this example, the gate electrode of the second transistor 324 may be coupled to a first bit line and the gate electrode of the first transistor 322 may be coupled to a second bit line associated with memory 308. Respective drain electrodes of the first transistor 322 and the second transistor 324 may be controllably coupled to power source 304. The current source 326 is coupled to the source electrodes of the first transistor 322 and the second transistor 324. A gate of the current source 326 may be coupled, for example, to a clocked bias voltage CLK.

In operation, sense amplifier 320 may be controllably coupled to power source 304. In other words, sense amplifier 320 may be coupled to power source 304 by controller 302 during sensing operations and may be decoupled from power source 304 otherwise. During sensing operations, controller 302 may be configured to provide a clock signal CLK to current source 326 to turn the current source on for sensing, e.g., to read a state of a memory cell included in memory 308. Controller 302 may be configured to turn current source 326 off otherwise. Thus, leakage power associated with transistors 322, 324 and 326 may be reduced and transistors 322 and 324 may each include a gate stack that includes a work function material layer configured to optimize a threshold voltage variation between the transistors 322 and 324.

Thus, device 300 may contain a plurality of transistors of a plurality of flavors. Transistors included in circuitry 306 may be configured with one or more operational characteristics, e.g., threshold voltage, drive current, etc. Transistors consistent with the present disclosure, e.g., transistors 312, 314, 322, 324, may each include a gate stack that contains a work function material layer configured to optimize a threshold voltage variation between the transistors 312, 314, 322, 324. The work function material layer may be configured to reduce and/or minimize a work function variation between the respective gate stacks of the respective transistors 312, 314, 322, 324.

Generally, this disclosure relates to transistor threshold voltage variation optimization. A transistor, e.g., a MOSFET, may include a gate stack structure configured to minimize a work function variation. The gate stack structure may be configured to reduce and/or minimize work function variation between transistors and to thus, optimize a corresponding threshold voltage variation between a plurality of transistors. For example, the optimized threshold voltage variation may correspond to a constant of proportionality of less than 1 mV-μm.

In an embodiment, the gate stack structure may contain selected materials (i.e., work function materials) configured to minimize variation in the work function. In another embodiment, the work function materials may be configured to include selected metal crystal structures or amorphous structures. Crystal structures may be single crystal or polycrystalline. In another embodiment, the work function materials may include metal crystal structures with a selected polycrystalline size. In another embodiment, film thickness associated with the work function materials may be selected to reduce and/or minimize work function variation. In another embodiment, the gate stack may be heterogeneous, i.e., may include a plurality of work function materials, metal structures, polycrystalline sizes and/or layers of work function materials. In another embodiment, the gate stack may include a plurality of the foregoing embodiments.

Thus, an apparatus, integrated circuit, device and/or system may contain a plurality of transistors of a plurality of transistor flavors. Some of the transistors, e.g., transistors utilized in differential pairs, may each contain a gate stack configured to minimize work function variation and thus a threshold voltage variation between the transistors.

As used in any embodiment herein, the term "logic" may refer to an app, software, firmware and/or circuitry configured to perform any of the aforementioned operations. Software may be embodied as a software package, code, instructions, instruction sets and/or data recorded on non-transitory computer readable storage medium. Firmware may be embodied as code, instructions or instruction sets and/or data that are hard-coded (e.g., nonvolatile) in memory devices.

"Circuitry", as used in any embodiment herein, may comprise, for example, singly or in any combination, hard-wired circuitry, programmable circuitry such as computer processors comprising one or more individual instruction processing cores, state machine circuitry, and/or firmware that stores instructions executed by programmable circuitry. The logic may, collectively or individually, be embodied as circuitry that forms part of a larger system, for example, an integrated circuit (IC), an application-specific integrated circuit (ASIC), a system on-chip (SoC), desktop computers, laptop computers, tablet computers, servers, smart phones, etc.

Memory 308 may include one or more of the following types of memory: semiconductor firmware memory, programmable memory, non-volatile memory, read only memory, electrically programmable memory, random access memory, flash memory, magnetic disk memory, and/or optical disk memory. Either additionally or alternatively system memory may include other and/or later-developed types of computer-readable memory.

In some embodiments, a hardware description language (HDL) may be used to specify circuit and/or logic implementation(s) for the various logic and/or circuitry described herein. For example, in one embodiment the hardware description language may comply or be compatible with a very high speed integrated circuits (VHSIC) hardware description language (VHDL) that may enable semiconductor fabrication of one or more circuits and/or logic described herein. The VHDL may comply or be compatible with IEEE Standard 1076-1987, IEEE Standard 1076.2, IEEE1076.1, IEEE Draft 3.0 of VHDL-2006, IEEE Draft 4.0 of VHDL-2008 and/or other versions of the IEEE VHDL standards and/or other hardware description standards.

In some embodiments, a Verilog hardware description language (HDL) may be used to specify circuit and/or logic implementation(s) for the various logic and/or circuitry described herein. For example, in one embodiment, the HDL may comply or be compatible with IEEE standard 62530-2011: SystemVerilog-Unified Hardware Design, Specification, and Verification Language, dated Jul. 7, 2011; IEEE Std 1800™-2012: IEEE Standard for SystemVerilog-Unified Hardware Design, Specification, and Verification Language, released Feb. 21, 2013; IEEE standard 1364-2005: IEEE Standard for Verilog Hardware Description Language, dated Apr. 18, 2006 and/or other versions of Verilog HDL and/or SystemVerilog standards.

EXAMPLES

Examples of the present disclosure include subject material such as a method, means for performing acts of the method, a device, or of an apparatus or system related to transistor threshold voltage variation optimization, as discussed below.

Example 1 According to this example, there is provided an apparatus. The apparatus includes a first transistor and a second transistor. The first transistor includes a first drain, a first source coupled to the first drain by a first channel, and a first gate stack including a plurality of layers. The second transistor includes a second drain, a second source coupled to the second drain by a second channel, and a second gate stack including a plurality of layers. Each gate stack includes a work function material layer to minimize a threshold voltage variation between the transistors.

Example 2 This example includes the elements of example 1, wherein the optimized threshold voltage variation corresponds to a constant of proportionality ($A_{VT}$) of less than one millivolt-micrometer (mV-μm), $A_{VT}$ relating a standard deviation ($\sigma_{VT}$) of a distribution of threshold voltage values across a plurality of transistors and a transistor channel dimension.

Example 3 This example includes the elements of example 1, wherein each work function material layer includes a work function material selected from the group including silver (Ag), gold (Au), cobalt (Co), molybdenum (Mo), ruthenium (Ru), tin (Sn), aluminum (Al), tungsten (W), platinum (Pt) and/or tantalum (Ta).

Example 4 This example includes the elements of example 1, wherein each work function material layer includes a work function material selected from the group including graphene, metallic TMDs (transition metal dichalcogenide), NbS2 (niobium sulfur 2), VS2 (vanadium sulfur 2), WTe2 (tungsten tellurium 2) and/or TiSe2 (titanium selenium 2).

Example 5 This example includes the elements of example 1, wherein a film thickness of each work function material layer is in the range of 1 A (Angstrom) to 500 A.

Example 6 This example includes the elements according to any one of examples 1 to 5, wherein each work function material layer comprises an amorphous structure.

Example 7 This example includes the elements according to any one of examples 1 to 5, wherein each work function material layer includes a crystal structure.

Example 8 This example includes the elements of example 7, wherein the crystal structure is polycrystalline and a polycrystalline grain size is in the range of 10 A (Angstrom) to 500 A.

Example 9 This example includes the elements according to any one of examples 1 to 5, wherein the work function material layers are to minimize a work function variation between the transistors.

Example 10 This example includes the elements of example 7, wherein each structure has a corresponding crystal phase, the corresponding crystal phase to minimize a work function variation between the transistors.

Example 11 This example includes the elements according to any one of examples 1 to 5, wherein each gate stack includes a plurality of work function material layers.

Example 12 This example includes the elements according to any one of examples 1 to 5, wherein each work function material layer includes a plurality of work function materials.

Example 13 This example includes the elements of example 2, wherein $\sigma_{VT}=A_{VT}/\sqrt{WL}$, where W and L are transistor channel width and channel length, respectively.

Example 14 According to this example, there is provided an integrated circuit. The integrated circuit includes a first plurality of transistors of a first flavor and a second plurality of transistors of a second flavor. The second plurality of transistors of the second flavor includes a first transistor and a second transistor. The first transistor includes a first drain, a first source coupled to the first drain by a first channel, and a first gate stack including a plurality of layers. The second transistor includes a second drain, a second source coupled to the second drain by a second channel, and a second gate stack including a plurality of layers. Each gate stack includes a work function material layer to minimize a threshold voltage variation between the transistors.

Example 15 This example includes the elements of example 14, wherein the optimized threshold voltage variation corresponds to a constant of proportionality ($A_{VT}$) of less than one millivolt-micrometer (mV-μm), $A_{VT}$ relating a standard deviation ($\sigma_{VT}$) of a distribution of threshold voltage values across a plurality of transistors and a transistor channel dimension.

Example 16 This example includes the elements of example 14, wherein each work function material layer includes a work function material selected from the group including silver (Ag), gold (Au), cobalt (Co), molybdenum (Mo), ruthenium (Ru), tin (Sn), aluminum (Al), tungsten (W), platinum (Pt) and/or tantalum (Ta).

Example 17 This example includes the elements of example 14, wherein each work function material layer includes a work function material selected from the group including graphene, metallic TMDs (transition metal dichalcogenide), NbS2 (niobium sulfur 2), VS2 (vanadium sulfur 2), WTe2 (tungsten tellurium 2) and/or TiSe2 (titanium selenium 2).

Example 18 This example includes the elements of example 14, wherein a film thickness of each work function material layer is in the range of 1 A (Angstrom) to 500 A.

Example 19 This example includes the elements according to any one of examples 14 to 18, wherein each work function material layer includes an amorphous structure.

Example 20 This example includes the elements according to any one of examples 14 to 18, wherein each work function material layer includes a crystal structure.

Example 21 This example includes the elements of example 20, wherein the crystal structure is polycrystalline and a polycrystalline grain size is in the range of 10 A (Angstrom) to 500 A.

Example 22 This example includes the elements according to any one of examples 14 to 18, wherein the work function material layers are to minimize a work function variation between the transistors.

Example 23 This example includes the elements of example 20, wherein each structure has a corresponding crystal phase, the corresponding crystal phase to minimize a work function variation between the transistors.

Example 24 This example includes the elements according to any one of examples 14 to 18, wherein each gate stack includes a plurality of work function material layers.

Example 25 This example includes the elements according to any one of examples 14 to 18, wherein each work function material layer includes a plurality of work function materials.

Example 26 This example includes the elements of example 15, wherein $\sigma_{VT}=A_{VT}/\sqrt{WL}$, where W and L are transistor channel width and channel length, respectively.

Example 27 According to this example, there is provided device. The device includes a controller, a power source, circuitry, a first transistor, and a second transistor. The first transistor includes a first drain, a first source coupled to the first drain by a first channel, and a first gate stack including a plurality of layers. The second transistor includes a second drain, a second source coupled to the second drain by a second channel, and a second gate stack including a plurality of layers. Each gate stack includes a work function material layer to minimize a threshold voltage variation between the transistors.

Example 28 This example includes the elements of example 27, wherein the optimized threshold voltage variation corresponds to a constant of proportionality ($A_{VT}$) of less than one millivolt-micrometer (mV-μm), $A_{VT}$ relating a standard deviation ($\sigma_{VT}$) of a distribution of threshold voltage values across a plurality of transistors and a transistor channel dimension.

Example 29 This example includes the elements of example 27, wherein each work function material layer includes a work function material selected from the group including silver (Ag), gold (Au), cobalt (Co), molybdenum (Mo), ruthenium (Ru), tin (Sn), aluminum (Al), tungsten (W), platinum (Pt) and/or tantalum (Ta).

Example 30 This example includes the elements of example 27, wherein each work function material layer includes a work function material selected from the group including graphene, metallic TMDs (transition metal dichalcogenide), NbS2 (niobium sulfur 2), VS2 (vanadium sulfur 2), WTe2 (tungsten tellurium 2) and/or TiSe2 (titanium selenium 2).

Example 31 This example includes the elements of example 27, wherein a film thickness of each work function material layer is in the range of 1 A (Angstrom) to 500 A.

Example 32 This example includes the elements according to any one of examples 27 to 31, wherein each work function material layer includes an amorphous structure.

Example 33 This example includes the elements according to any one of examples 27 to 31, wherein each work function material layer includes a crystal structure.

Example 34 This example includes the elements of example 33, wherein the crystal structure is polycrystalline and a polycrystalline grain size is in the range of 10 A (Angstrom) to 500 A.

Example 35 This example includes the elements according to any one of examples 27 to 31, wherein the work function material layers are to minimize a work function variation between the transistors.

Example 36 This example includes the elements of example 33, wherein each structure has a corresponding crystal phase, the corresponding crystal phase to minimize a work function variation between the transistors.

Example 37 This example includes the elements according to any one of examples 27 to 31, wherein each gate stack includes a plurality of work function material layers.

Example 38 This example includes the elements according to any one of examples 27 to 31, wherein each work function material layer includes a plurality of work function materials.

Example 39 This example includes the elements according to any one of examples 27 to 31, wherein the controller is to controllably couple the first transistor and the second transistor to the power source.

Example 40 This example includes the elements according to any one of examples 27 to 31, wherein the circuitry includes a plurality of transistors of a second flavor, the first transistor in the second transistor corresponding to a first flavor.

Example 41 This example includes the elements according to any one of examples 27 to 31, wherein the first transistor and the second transistor are configured as a differential pair.

Example 42 This example includes the elements according to any one of examples 27 to 31, wherein the first transistor and the second transistor are included in a sense amplifier.

Example 43 This example includes the elements of example 28, wherein $\sigma_{VT}=A_{VT}/\sqrt{WL}$, where W and L are transistor channel width and channel length, respectively.

The terms and expressions which have been employed herein are used as terms of description and not of limitation, and there is no intention, in the use of such terms and expressions, of excluding any equivalents of the features shown and described (or portions thereof), and it is recognized that various modifications are possible within the scope of the claims. Accordingly, the claims are intended to cover all such equivalents.

Various features, aspects, and embodiments have been described herein. The features, aspects, and embodiments are susceptible to combination with one another as well as to variation and modification, as will be understood by those having skill in the art. The present disclosure should, therefore, be considered to encompass such combinations, variations, and modifications.

What is claimed is:

1. An apparatus comprising:
    a first transistor comprising a first drain, a first source coupled to the first drain by a first channel, and a first gate stack comprising a first plurality of layers;
    wherein the first plurality of layers includes a work function material layer that includes at least one of: silver (Ag), gold (Au), cobalt (Co), molybdenum (Mo), ruthenium (Ru), tin (Sn), aluminum (Al), tungsten (W), platinum (Pt), and tantalum (Ta); and
    wherein the first plurality of layers further includes another work function material layer that includes at least one of: graphene, metallic TMDs (transition metal dichalcogenide), NbS2 (niobium sulfur 2), VS2 (vanadium sulfur 2), WTe2 (tungsten tellurium 2), and TiSe2 (titanium selenium 2); and
    a second transistor comprising a second drain, a second source coupled to the second drain by a second channel, and a second gate stack comprising a second plurality of layers,
    wherein the second plurality of layers includes a work function material layer that includes at least one of: silver (Ag), gold (Au), cobalt (Co), molybdenum (Mo), ruthenium (Ru), tin (Sn), aluminum (Al), tungsten (W), platinum (Pt), and tantalum (Ta); and
    wherein the second plurality of layers further includes another work function material layer that includes at least one of: graphene, metallic TMDs (transition metal dichalcogenide), NbS2 (niobium sulfur 2), VS2 (vanadium sulfur 2), WTe2 (tungsten tellurium 2), and TiSe2 (titanium selenium 2).

2. The apparatus of claim 1, wherein each work function material layer is to optimize a threshold voltage variation between the first transistor and the second transistors, the optimized threshold voltage variation corresponding to a constant of proportionality ($A_{VT}$) of less than one millivolt-micrometer (mV-μm);
    wherein $A_{VT}$ relates a standard deviation ($\sigma_{VT}$) of a distribution of threshold voltage values across a plurality of transistors and a transistor channel dimension.

3. The apparatus of claim 1, wherein a film thickness of each work function material layer is in the range of 1 A (Angstrom) to 500 A.

4. The apparatus of claim 1, wherein each work function material layer comprises an amorphous structure.

5. The apparatus of claim 1, wherein each work function material layer comprises a crystal structure.

6. The apparatus of claim 5, wherein the crystal structure is polycrystalline and a polycrystalline grain size is in the range of 10 A (Angstrom) to 500 A.

7. An integrated circuit comprising:
    a first plurality of transistors of a first flavor; and
    a second plurality of transistors of a second flavor comprising:
        a first transistor comprising a first drain, a first source coupled to the first drain by a first channel, and a first gate stack comprising a first plurality of layers;
        wherein the first plurality of layers includes a work function material layer that includes at least one of: silver (Ag), gold (Au), cobalt (Co), molybdenum (Mo), ruthenium (Ru), tin (Sn), aluminum (Al), tungsten (W), platinum (Pt), and tantalum (Ta); and wherein the first plurality of layers further includes another work function material layer that includes at least one of: graphene, metallic TMDs (transition metal dichalcogenide), NbS2 (niobium sulfur 2), VS2 (vanadium sulfur 2), WTe2 (tungsten tellurium 2), and TiSe2 (titanium selenium 2); and a second transistor comprising a second drain, a second source coupled to the second drain by a second channel, and a second gate stack comprising a second plurality of layers;

wherein the second plurality of layers includes a work function material layer that includes at least one of: silver (Ag), gold (Au), cobalt (Co), molybdenum (Mo), ruthenium (Ru), tin (Sn), aluminum (Al), tungsten (W), platinum (Pt), and tantalum (Ta); and wherein the second plurality of layers further includes another work function material layer that includes at least one of: graphene, metallic TMDs (transition metal dichalcogenide), NbS2 (niobium sulfur 2), VS2 (vanadium sulfur 2), WTe2 (tungsten tellurium 2), and TiSe2 (titanium selenium 2).

8. The integrated circuit of claim 7, wherein each work function material layer is to optimize a threshold voltage variation between the first transistor and the second transistor, the optimized threshold voltage variation corresponding to a constant of proportionality ($A_{VT}$) of less than one millivolt-micrometer (mV-μm);

wherein $A_{VT}$ relates a standard deviation ($\sigma_{VT}$) of a distribution of threshold voltage values across a plurality of transistors and a transistor channel dimension.

9. The integrated circuit of claim 7, wherein each of the first gate stack and the second gate stack comprises a plurality of work function material layers.

10. The integrated circuit of claim 7, wherein a film thickness of each work function material layer is in the range of 1 A (Angstrom) to 500 A.

11. The integrated circuit of claim 7, wherein each work function material layer comprises an amorphous structure.

12. The integrated circuit of claim 7, wherein each work function material layer comprises a crystal structure.

13. The integrated circuit of claim 12, wherein the crystal structure is polycrystalline and a polycrystalline grain size is in the range of 10 A (Angstrom) to 500 A.

14. A device comprising:
a controller;
a power source;
circuitry;
a first transistor comprising a first drain, a first source coupled to the first drain by a first channel, and a first gate stack comprising a first plurality of layers;

wherein the first plurality of layers includes a work function material layer that includes at least one of: silver (Ag), gold (Au), cobalt (Co), molybdenum (Mo), ruthenium (Ru), tin (Sn), aluminum (Al), tungsten (W), platinum (Pt), and tantalum (Ta); and wherein the first plurality of layers further includes another work function material layer that includes at least one of: graphene, metallic TMDs (transition metal dichalcogenide), NbS2 (niobium sulfur 2), VS2 (vanadium sulfur 2), WTe2 (tungsten tellurium 2), and TiSe2 (titanium selenium 2); and a second transistor comprising a second drain, a second source coupled to the second drain by a second channel, and a second gate stack comprising a second plurality of layers, wherein the second plurality of layers includes a work function material layer that includes at least one of: silver (Ag), gold (Au), cobalt (Co), molybdenum (Mo), ruthenium (Ru), tin (Sn), aluminum (Al), tungsten (W), platinum (Pt), and tantalum (Ta); and wherein the second plurality of layers further includes another work function material layer that includes at least one of: graphene, metallic TMDs (transition metal dichalcogenide), NbS2 (niobium sulfur 2), VS2 (vanadium sulfur 2), WTe2 (tungsten tellurium 2), and TiSe2 (titanium selenium 2).

15. The device of claim 14, wherein each work function material layer is to optimize a threshold voltage variation between the first transistor and the second transistor, the optimized threshold voltage variation corresponding to a constant of proportionality ($A_{VT}$) of less than one millivolt-micrometer (mV-μm);

wherein $A_{VT}$ relates a standard deviation ($\sigma_{VT}$) of a distribution of threshold voltage values across a plurality of transistors and a transistor channel dimension.

16. The device of claim 14, wherein a film thickness of each work function material layer is in the range of 1 A (Angstrom) to 500 A.

17. The device of claim 14, wherein each work function material layer comprises an amorphous structure.

18. The device of claim 14, wherein each work function material layer comprises a crystal structure.

19. The device of claim 18, wherein the crystal structure is polycrystalline and a polycrystalline grain size is in the range of 10 A (Angstrom) to 500 A.

* * * * *